(12) United States Patent
Schreiner et al.

(10) Patent No.: US 7,065,846 B2
(45) Date of Patent: Jun. 27, 2006

(54) INSULATION FOR PIEZOCERAMIC MULTILAYER ACTUATORS

(75) Inventors: Hans-Jurgen Schreiner, Neunkirchen am SandRollhofen (DE); Reiner Bindig, Bindlach (DE); Jurgen Schmieder, Lauf (DE)

(73) Assignee: Ceramtec AG Innovative Ceramic Engineering, Plochingen (DE)

( * ) Notice: Subject to any disclaimer, the term of this patent is extended or adjusted under 35 U.S.C. 154(b) by 146 days.

(21) Appl. No.: 10/615,603

(22) Filed: Jul. 8, 2003

(65) Prior Publication Data
US 2004/0134049 A1 Jul. 15, 2004

(30) Foreign Application Priority Data
Jul. 11, 2002 (DE) ............................. 102 31 536

(51) Int. Cl.
*H04R 17/00* (2006.01)
*H01L 41/04* (2006.01)
*H01L 41/08* (2006.01)
*H01L 41/18* (2006.01)
*H02N 2/00* (2006.01)

(52) U.S. Cl. ............... 29/25.35; 29/592.1; 29/831; 29/846; 29/851; 310/332; 310/338; 310/359; 310/366

(58) Field of Classification Search ............. 29/25.35, 29/592.1, 831, 846, 851; 310/332, 338, 359, 310/366; 427/96.1–96.5, 100, 123, 124, 427/226, 126.3, 98.3; 252/419, 512, 518
See application file for complete search history.

(56) References Cited

U.S. PATENT DOCUMENTS

| 4,523,121 A | * | 6/1985 | Takahashi et al. | .......... 310/334 |
| 4,812,698 A | * | 3/1989 | Chida et al. | ................ 310/330 |
| 4,845,399 A | | 7/1989 | Yasuda | |

(Continued)

FOREIGN PATENT DOCUMENTS

| DE | 3330538 A1 | 3/1985 |
| DE | 4036287 A1 | 5/1991 |

(Continued)

*Primary Examiner*—A. Dexter Tugbang
*Assistant Examiner*—Tai Nguyen
(74) *Attorney, Agent, or Firm*—Fulbright & Jaworski L.L.P.

(57) ABSTRACT

The invention relates to a method for the manufacture of piezoelectric multilayer actuator in which thin layers of a piezoceramic material, called "green leaves" on which at least one internal electrode is applied, are stacked to form a block such that the internal electrodes are guided in alternation to oppositely lying surfaces of the actuator, where they become bound together by an external electrode, the actuator compact being sintered and subjected to abrasive shaping, and then the base metallization is applied for the external electrode.

In order to achieve insulation with a ceramic layer which can be applied after the sintering and the abrasive shaping, and thus satisfy even stringent requirements, it is proposed that areas to be insulated be coated by thick-layer methods with a paste consisting of an inorganic, low-sintering material or a mixture of materials and an organic binder system, and be then subjected to a burning-on process, the coating thickness after the sintering being between 1 and 40 μm, preferably between 2 and 20 μm, or between 4 and 15 μm.

11 Claims, 1 Drawing Sheet

U.S. PATENT DOCUMENTS

| | | | |
|---|---|---|---|
| 4,863,683 A * | 9/1989 | Nakatani et al. | 419/10 |
| 5,034,649 A * | 7/1991 | Chida et al. | 310/332 |
| 5,144,528 A | 9/1992 | Watanabe et al. | |
| 5,250,868 A * | 10/1993 | Shirasu | 310/328 |
| 5,254,212 A | 10/1993 | Someji et al. | |
| 5,281,885 A | 1/1994 | Watanabe | |
| 5,406,164 A | 4/1995 | Okawa | |

FOREIGN PATENT DOCUMENTS

| | | |
|---|---|---|
| DE | 41 32 723 C2 | 4/1992 |
| DE | 19840488 A1 | 3/1999 |
| DE | 100 21 919 A1 | 8/2001 |
| DE | 10021919 C2 | 3/2002 |
| JP | 7-226541 | 8/1995 |

* cited by examiner

INSULATION FOR PIEZOCERAMIC MULTILAYER ACTUATORS

FIELD OF THE INVENTION

The invention relates to a method for the manufacture of piezoelectric multilayer actuators (called "actuators") hereinafter, and to an actuator manufactured by this method.

BACKGROUND AND SUMMARY OF THE INVENTION

Figure 1:
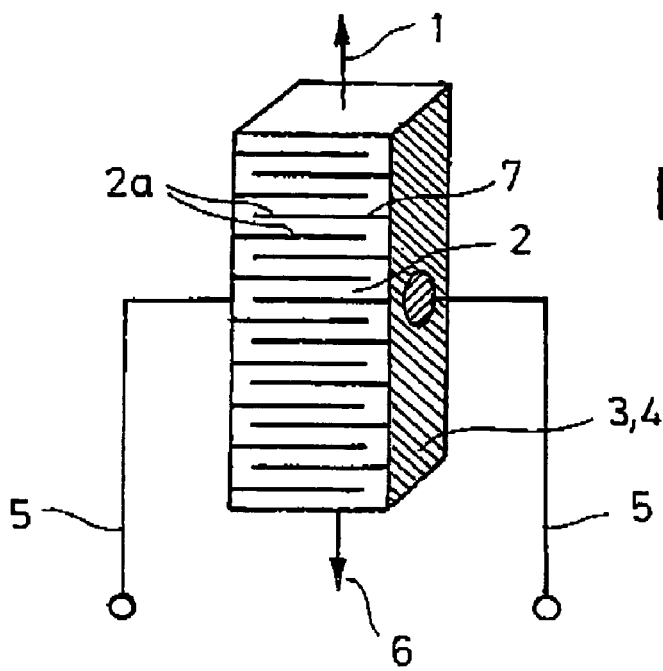

Piezoceramic multilayer actuator (see FIG. 1) in the state of the art consist of stacked thin layers of piezoelectrically active material 2, e.g., lead zirconate titanate (PZT) with conductive internal electrodes 7 arranged between them, which run alternately to the surface of the actuator. External electrodes 3 and 4 connect these internal electrodes together. The internal electrodes are thereby connected electrically parallel and in a combination of two sets constituting the two terminal poles of the actuator. If an electrical voltage is applied to the terminal poles it is transferred parallel to all of the internal electrodes and cause an electrical field in all layers of the active material which is thereby deformed mechanically. The sum of all these mechanical deformations is available at the end surfaces of the actuator as useful expansion 6 and/or force.

Piezoceramic multilayer actuators are, in the state of the art, made in the form of monoliths, that is, the active material in the form of so-called green films are provided by screen printing methods with internal electrodes prior to sintering, pressed into actuator stacks, pyrolyzed and then sintered, resulting in the monolithic actuator.

A metal ground coating 3 is applied to the actuator stack 1 in the area of the brought-out internal electrodes 7, e.g., by screen printing with metal paste. This metal ground coating is strengthened by applying a metal material 4, e.g, by soldering on an embossed plate or a wire mesh. The electrical connecting wire 5 is soldered onto this strengthened coating.

The structure and the manufacture of such actuators and external electrodes is thoroughly described, e.g., in DE 33 30 538 A1, DE 40 36 287 C2, U.S. Pat. No. 5,281,885, U.S. Pat. No. 4,845,399, U.S. Pat. No. 5,406, 164 and JP 07-226541 A.

The spacing between the internal electrodes 2a of different polarity leading out interdigitally is so small that a flashover would take place at the surface at the working voltage. Therefore the surface is usually covered with an insulating varnish. The fact that thin varnishes offer only an insufficient protection against contact and are mechanically delicate is a disadvantage. Thick varnishes, on the other hand, tend to come loose in operation or when exposed to temperature change. The expression, interdigital areas, is to be understood to refer to the outwardly leading internal electrodes 2a in FIG. 1 between the contacted sides 3 and 4.

Another possibility is to keep the electrodes from reaching all the way to the surface ("buried electrodes"), or to have only the electrodes of one polarity emerge at the surface ("half-buried electrodes"). The disadvantage is that the active surface is diminished and thus the development of the actuator's power is reduced. At the same time these inactive zones result in a cramping of the actuator and are liable to crazing.

Another possibility for protecting the surface is to apply a ceramic film to the green surface of the actuator, sintered them with the actuator in order thus to achieve insulation (DE 10 021 919 A1). A disadvantage in this method is that the outside dimensions of the actuator cannot be reproduced very accurately due to shrinkage during sintering. Moreover, this insulating layer is made relatively thick by the process (typically >50 µm) and thus has disadvantages similar to the two methods described above.

The invention is addressed to the problem of achieving insulation with a ceramic which can be applied after sintering and shaping by grinding and thus can satisfy even severe geometric requirements.

This problem is solved according to the present invention, which relates to a method for the manufacture of piezoelectrical multilayer actuator, wherein thin coats of a piezoceramic material, called green leaves, are applied to the at least one internal electrode, are thus stacked one on the other in a block, that the internal electrodes are brought alternately to opposite faces of the actuator where they are connected together by an external electrode, the actuator green body being sintered and subject to an abrasive shaping and then the ground metallization for the external electrode is applied, characterized in that the areas to be insulated are coated by thick-layer methods with a paste consisting of an inorganic, low-sintering material or material mixture and an organic binder system, and then are subjected to a firing process wherein the layer thickness after sintering is between 1 and 40 µm.

DETAILED DESCRIPTION

The present invention is directed to a method for the manufacture of piezoelectrical multilayer actuators by applying thin coats of a piezoceramic material to at least one internal electrode. The internal electrodes are brought alternately to opposite faces of the actuator where they are connected by an external electrode. The actuator green body is then sintered and abrasively shaped. The ground metallization for the external electrode is applied. The areas to be insulated are coated by thick-layer methods with a paste made of an inorganic, low-sintering material or material mixture and an organic binder system. This is this sintered to achieve a layer thickness of between 1 and 40 microns after sintering, preferably between 2 and 20 microns and more preferably between 4 and 15 microns.

Advantageously the coating takes place after the sintering and shaping, and the coating is fired on at temperatures between 400 and 1200° C. or between 600 and 1000° C., or preferably between 650 and 850° C.

Preferably the firing of the insulating layer takes place together with the firing on of the external electrode and forms a continuous coating.

In an alternative embodiment, the application of the insulating coating is made after the polarization of the actuator and, by drying at 20 to 250° C., preferably at 80 to 120° C., all electrodes of one polarity are covered, but not the electrodes of the other polarity, and thus no continuous coating is formed.

Preferably the low-sintering material is PZT (lead-zirconate-titanate) and/or it is identical with the actuator material.

Advantageously, the thick coating paste consists of a glass and an organic binder system.

Preferably the thick coating paste is applied to the green actuator body and sintered together with the latter.

In an advantageous embodiment the thick coating is applied by silk-screen printing, rubber-stamping or rolling or by plasma spraying.

An actuator which is made by the method of the invention serves advantageously for the control of an injection valve in motor vehicles.

Additional features of the invention will appear from the figures and the embodiments which are described below.

The surfaces to be insulated are coated by thick layer methods with a paste consisting of low-sintering PZT (known, for example, from DE 19 840 488 A1) and an organic binder system. This insulating coating is fired on at temperatures between 500 and 1200° C., preferably between 600 and 900° C.

In another embodiment the actuator is polarized before the screen-printed coating is applied, so that, when the paste is dried at 80–120° C. pyrotension is the result. Due to electrophoretic processes this pyrotension brings the result that only every second electrode becomes coated with PZT particles. As a result, an outstanding insulation of the electrodes of different polarity is assured after sintering, without the surface being covered by a coherent layer to interfere with expansion or the development of power in the actuator.

EXAMPLES OF PREFERRED EMBODIMENTS

The actuator is constructed as usual by bringing the electrodes out interdigitally on all sides, but not on the surfaces that are to be contacted. The actuator's green body is sintered and can be subjected to high-precision shaping by grinding. Then the base metallization of the external electrode (making contact with electrodes of one polarity) can be applied by silk screen printing.

Figure 2:
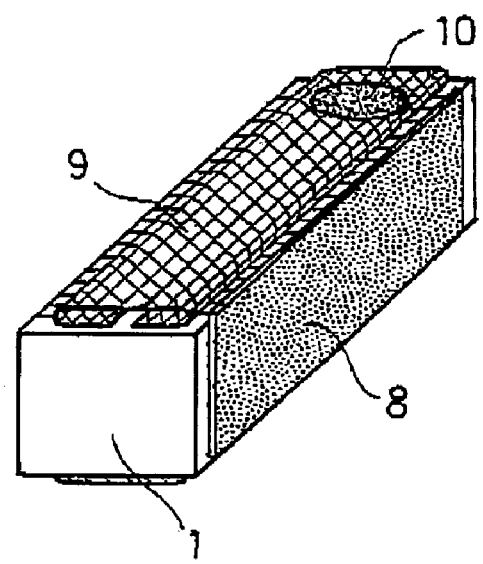

Method 1: The insulating coat 8 is applied by thick layer methods together with the external electrode layers (ground metallization) and fired on together (600<TS<900° C.). The insulating coat now covers all of the interdigital areas 8 of the actuator with a coating between 2 and 20 µm, preferably 4–15 µm, thick. The latter is strongly adherent and scratch-resistant and interferes but negligibly with the stroke or power development of the actuator (FIG. 2). Then the external electrode is soldered to a screen 9 and further contacted 10. FIG. 2 shows an actuator with external electrodes, insulated by screen printing (full-surface).

Figure 3:
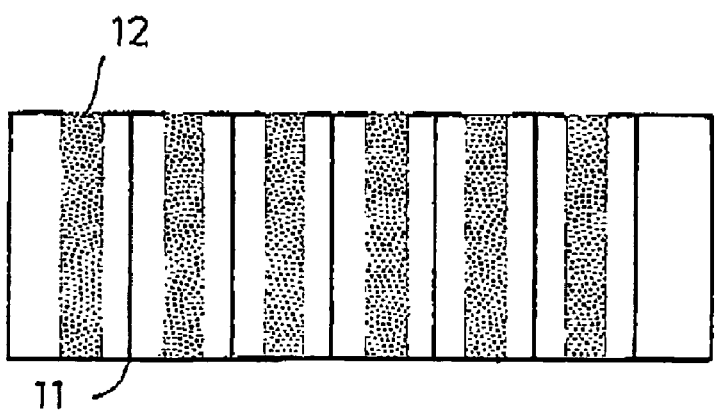

Method 2: The external electrode (ground metallization) is fired. The actuator is then polarized and on the surfaces, which have an interdigital structure, a paste is applied, consisting of low-sintering PZT and an organic binder system. When the paste is dried at 20–250° C., due to the pyroelectric effect of the ferroelectric ceramic, an electric field is produced in the still not dried paste. Consequently, electrophoretic processes occur in the paste, so that only every second internal electrode is covered (electrodes of one polarity (FIG. 3, No. 12). The electrodes 11 of the other polarity are not covered. A subsequent firing process at temperatures around 750° C. results in an adherent and scratch-resistant insulation (FIG. 3). FIG. 3 shows the insulating surface of an actuator with internal electrodes 11 and insulation 12 of every second internal electrode by silk-screen printing (interrupted).

The invention claimed is:

1. A method for the manufacture of a piezoelectrical multilayer actuator comprising applying thin coats of a piezoceramic material as green leaves, to at least one internal electrode such that the green leaves are stacked one on the other in a block and the internal electrodes are brought alternately to opposite faces of the actuator where they are connected together by an external electrode to form an actuator green body; sintering the actuator green body; abrasively shaping the sintered green body; applying ground metallization for the external electrode; applying an area of said actuator to be insulated by thick-layer method a paste comprising an inorganic, low-sintering material or material mixture and an organic binder system, and subjecting the body coated with said paste to a firing process wherein the layer thickness after sintering is between 1 and 40 µm, preferably between 2 and 20 µm or between 4 and 15 µm, wherein-the firing on of the insulating layer takes place together with the firing on of the external electrode and forms a continuous layer.

2. The method according to claim 1, wherein the coating step is performed after sintering and shaping and the coating is fired on at temperatures between 400 and 1200° C.

3. The method according to claim 1, wherein the low-sintering material is PZT or is identical with the actuator material.

4. The method according to claim 1, wherein the thick layer paste comprises a glass and an organic binder system.

5. The method according to claim 1, wherein the thick layer paste is applied to the green actuator body and is sintered together therewith.

6. The method according to claim 1, wherein the thick layer is applied by silk-screen printing.

7. The method according to claim 1, wherein the thick layer is applied by rubber-stamping or rolling.

8. The method according to claim 1, wherein the thick layer is applied by plasma spraying.

9. The method according to claim 1, wherein the coating step is performed after sintering and shaping and the coating is fired on at temperatures between 600 and 1000° C.

10. The method according to claim 1, wherein the coating step is performed after sintering and shaping and the coating is fired on at temperatures between 650 and 850° C.

11. A method for the manufacture of a piezoelectrical multilayer actuator comprising applying thin coats of a piezoceramic material as green leaves, to at least one internal electrode such that the green leaves are stacked one on the other in a block and the internal electrodes are brought alternately to opposite faces of the actuator where they are connected together by an external electrode to form an actuator green body; sintering the actuator green body; abrasively shaping the sintered green body; applying ground metallization for the external electrode; applying an area of said actuator to be insulated by thick-layer method a paste comprising an inorganic, low-sintering material or material mixture and an organic binder system, and subjecting the body coated with said paste to a firing process wherein the layer thickness after sintering is between 1 and 40 µm, preferably between 2 and 20 µm or between 4 and 15 µm, wherein the application of the insulating layer takes place after the polarization of the actuator and, by drying at 20–260° C. a covering of all electrodes of one polarity is formed, but no covering of the electrodes of the other polarity and thus a continuous coating is not formed.

* * * * *